United States Patent
Chang et al.

(10) Patent No.: US 8,637,148 B2
(45) Date of Patent: Jan. 28, 2014

(54) COATED ARTICLE AND METHOD OF MAKING THE SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Ying-Ying Wang, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 172 days.

(21) Appl. No.: 13/172,234

(22) Filed: Jun. 29, 2011

(65) Prior Publication Data
US 2012/0244382 A1    Sep. 27, 2012

(30) Foreign Application Priority Data
Mar. 21, 2011   (CN) .......................... 2011 1 0067216

(51) Int. Cl.
*B32B 9/00*    (2006.01)

(52) U.S. Cl.
USPC .......................................... 428/336; 428/698

(58) Field of Classification Search
USPC ................................... 428/336, 698
See application file for complete search history.

(56) References Cited

U.S. PATENT DOCUMENTS

| 3,827,953 A | * | 8/1974 | Haldeman | 427/328 |
| 4,284,687 A | * | 8/1981 | Dreyer et al. | 428/336 |
| 4,734,339 A | * | 3/1988 | Schachner et al. | 428/701 |
| 5,223,350 A | * | 6/1993 | Kobayashi et al. | 428/697 |
| 8,129,040 B2 | * | 3/2012 | Quinto et al. | 428/698 |

FOREIGN PATENT DOCUMENTS

| DE | 19741800 | * | 3/1998 |
| JP | 2002-206161 | * | 7/2002 |
| JP | 2007-277019 | * | 10/2007 |
| WO | 01/36341 | * | 5/2001 |

* cited by examiner

*Primary Examiner* — Archene Turner
(74) *Attorney, Agent, or Firm* — Altis Law Group, Inc.

(57) ABSTRACT

A coated article includes a bonding layer, an iridium layer, a chromium oxynitride layer and a chromium nitride layer formed on a substrate in that order. The substrate is made of die steel.

7 Claims, 2 Drawing Sheets

COATED ARTICLE AND METHOD OF MAKING THE SAME

BACKGROUND

1. Technical Field

This disclosure relates to a coated article and a method of making the same.

Die steel is widely applied to production processes, e.g., forging, punching, die casting. However, the surface of the die steel can easily oxidize at a high temperature, and the oxidation may affect the appearance of the products. A film made of metal nitride and metal carbide can be formed on the die steel by physical vapor deposition (PVD) to give it a high hardness and chemical stability. The problem with this is that the film made of metal nitride and metal carbide does not have a good adhesion to metal bases and may be easily peeled off.

Therefore, there is room for improvement within the art.

BRIEF DESCRIPTION OF THE DRAWINGS

Many aspects of the coated article and method of making the same can be better understood with reference to the following drawings. The components in the drawings are not necessarily drawn to scale, the emphasis instead being placed upon clearly illustrating the principles of the coated article and method of making the same.

DETAILED DESCRIPTION

Figure 1:
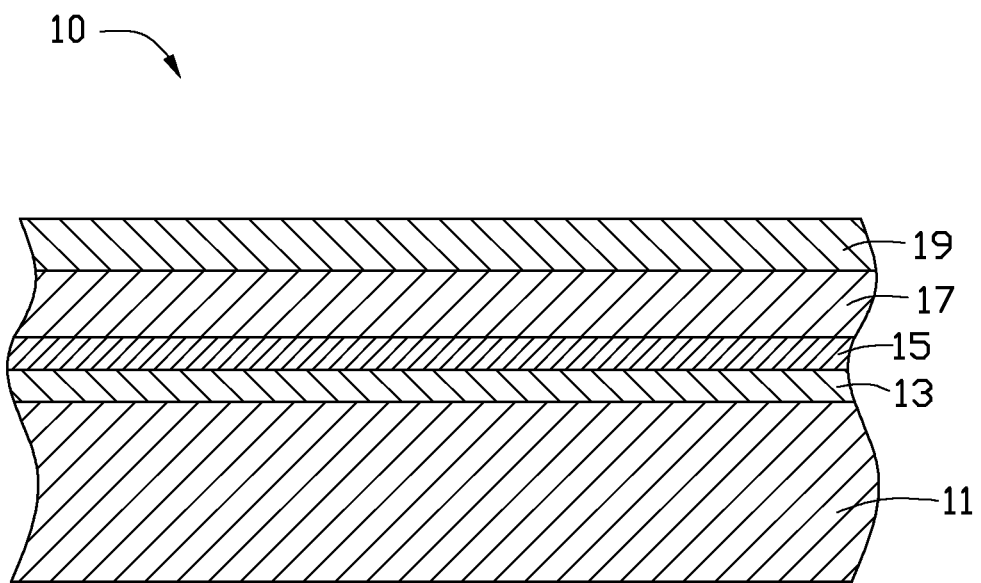
FIG. 1 is a schematic view of a coated article, in accordance with an exemplary embodiment.

FIG. 1 shows an exemplary embodiment of a coated article 10. The coated article 10 includes substrate 11 having a bonding layer 13, an iridium (Ir) layer 15, a chromium oxynitride (CrON) layer 17, and a chromium nitride (CrN) layer 19 formed thereon and in that order. The substrate 11 is made of die steel. In the exemplary embodiment, the substrate 11 is used to mold glass products. The layers 13, 15, 17, 19 are formed by magnetron sputtering. The bonding layer 13 is made of chromium (Cr) and has a thickness of about 20 nm to about 50 nm.

The iridium layer 15 has a thickness of about 10 nm to about 30 nm. Since iridium has a low saturation vapor pressure and low oxygen permeability, the iridium layer 15 will not oxidize in high temperatures. The iridium layer 15 can retain good mechanical performance even if the iridium layer 15 is put in an atmosphere where temperature is above 1600.

The chromium oxynitride layer 17 has a thickness of about 50 nm to about 500 nm. The chromium oxynitride layer 17 prevents oxygen in the atmosphere from diffusing in the layers 13, 15, 17.

The chromium nitride layer 19 has a thickness of about 20 nm to about 80 nm. The chromium nitride layer 19 has a wear resistant property, and prevents the chromium oxynitride 17 from wearing and scratching.

A method of making the coated article 10 includes the following steps:

A substrate 11 is provided. The substrate 11 can be made of die steel. In the exemplary embodiment, the substrate 11 is used to mold glass products.

The substrate 11 is immersed into an absolute ethanol solution and is cleaned by ultrasound for about 5 minutes (min) to about 10 min to remove the stains on the surface of the substrate 11.

Figure 2:
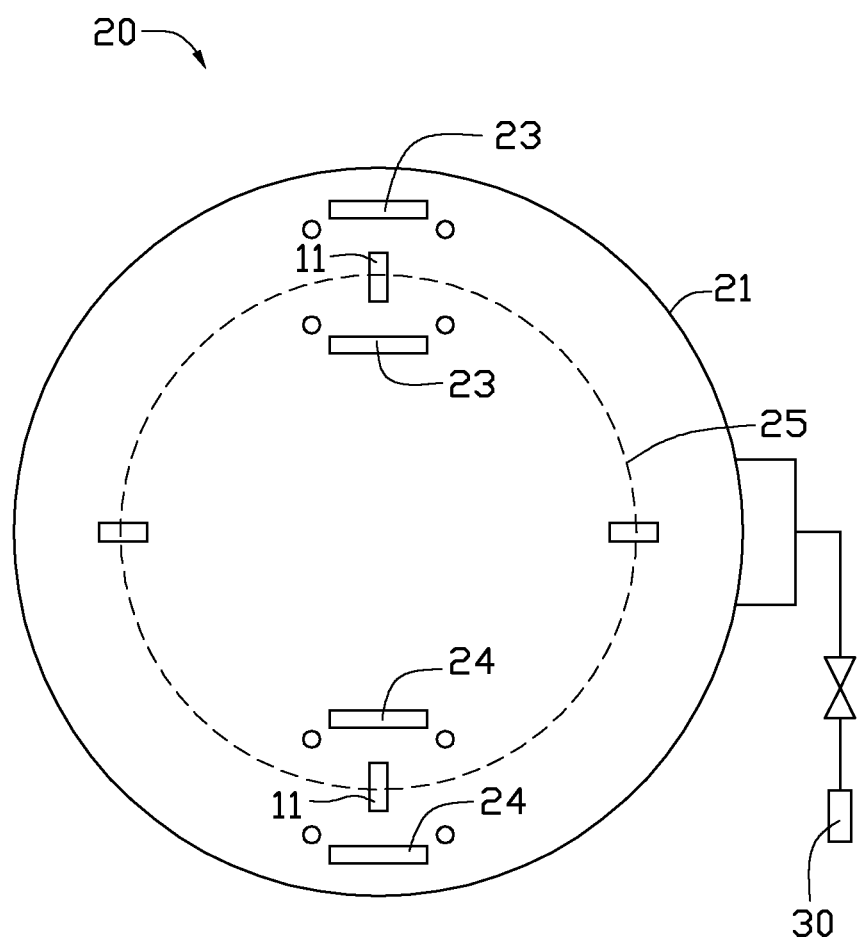
FIG. 2 is a schematic view of a vacuum sputtering coating machine used to form the coated article shown in FIG. 1.

Furthermore, the substrate 11 is cleaned by argon gas plasma. This process can further remove oil on the substrate 11 to increase a surface roughness of the substrate 11 for enhancing the bond between the substrate 11 and the subsequent layer formed on the substrate 11. Referring to FIG. 2, in this process, a vacuum sputtering coating machine 20 is used. The coating machine 20 includes a vacuum chamber 21 and a vacuum air pump 30 to evacuate the vacuum chamber 21. A rotating stand (not shown), two chromium targets 23 and two iridium targets 24 are disposed in the vacuum chamber 21. The rotating stand allows the substrate 11 to rotate along a circular trace 25 while the substrate 11 rotates along its own axis.

During cleaning, the chamber is evacuated to be about $3.0 \times 10^{-5}$ pascals (Pa). Argon gas is then injected into the chamber 21 at a flow rate of 500 standard cubic centimeter per minute (sccm). The purity of the argon gas is about 99.9999%. The pressure in the chamber 21 is about $6.7 \times 10^{-3}$ Pa. A voltage in a range of about −200 V to about −500 V is applied to the substrate 11, and the substrate 11 is then cleaned with argon gas plasma. The cleaning takes about 3 min to about 10 min.

A bonding layer 13 made of chromium is formed on the substrate 11 by magnetron sputtering. The chromium targets 23 are activated. Power of each chromium target 23 is about 3 kw to about 8 kw. Argon gas is provided as a working gas having a flow rate in a range of 100 sccm to 300 sccm. A voltage in a range of −100 V to −300 V is applied to the substrate 11. The substrate 11 is then heated to at a temperature from about 80° C. to about 120° C. The sputtering time is in a range of 5 min to 10 min. A thickness of the bonding layer 13 is from about 20 nm to about 50 nm.

Additionally, an iridium layer 15 is formed on the bonding layer 13 by magnetron sputtering. The chromium targets 23 are turned off and the iridium targets 24 are activated. A power of each iridium target 24 is from about 3 kw to about 8 kw. Argon gas is provided as a working gas having a flow rate in a range of 100 sccm to 300 sccm. A voltage in a range of −100 V to −300 V is applied to the substrate 11. The substrate 11 is heated to a temperature from about 80° C. to 120° C. The sputtering time is in a range of 5 min to 10 min. The resulting thickness of the iridium layer 15 is about 10 nm to about 30 nm.

Then, A chromium oxynitride layer 17 is formed on the iridium layer 15 by magnetron sputtering. The iridium targets 23 are turned off and the chromium targets 24 are activated. The power of each chromium target 24 is from about 3 kw to about 8 kw. Oxygen gas and nitrogen gas are reaction gases and are injected into the vacuum chamber 21. The flow rate of the oxygen gas is in a range of 50 sccm to 100 sccm and the flow rate of the nitrogen gas is in a range of 100 sccm to 300 sccm. The other technological parameters are similar to those of the step of forming the bonding layer. The sputtering time takes for about 30 min to about 100 min. The chromium oxynitride layer 17 has a thickness from about 50 nm to about 500 nm.

Lastly, a chromium nitride layer 19 is formed on the chromium oxynitride layer 17 by magnetron sputtering. Nitrogen gas acts as a reaction gas and is injected into the vacuum chamber 21 at a flow rate of about 100 sccm to about 300 sccm. The other technological parameters are similar to those of the step of forming the bonding layer. The sputtering time is in a range of about 10 min to about 20 min. The chromium oxynitride layer 17 has a thickness from about 20 nm to about 80 nm.

The present disclosure is described further in detail using examples as follows, but is not limited by the following examples.

Example I

In this embodiment, the vacuum sputtering coating machine 20 is a mid-frequency magnetron sputtering machine, made by Shenzhen Nanfang Chuangxin Vacuum Technology Co., Ltd., type: SM-1100H.

To clean the substrate 11 by argon gas plasma, the flow rate of the argon gas is about 500 sccm. A voltage of about −200V is applied to the substrate 11. The cleaning time is about 10 min.

To form the bonding layer 13, the flow rate of the argon gas is about 100 sccm. A voltage of about −100V is applied to the substrate 11. The substrate 11 is heated at a temperature of about 80° C. The sputtering time is 5 min. The thickness of the bonding layer 13 is 20 nm.

To form the iridium layer 15, the power of the iridium target 24 is about 3 kw. The flow rate of the argon gas is about 100 sccm. A voltage of about −100V is applied to the substrate 11. The substrate 11 is heated at a temperature of about 80° C. The sputtering time is about 5 min. A thickness of the iridium layer 15 is about 10 nm.

To form the chromium oxynitride layer 17, the flow rate of the oxygen gas is about 50 sccm. The flow rate of the nitrogen gas is about 100 sccm. The other technological parameters are similar to the process of forming the bonding layer 13. The sputtering time is about 30 min. A thickness of the chromium oxynitride layer 17 is about 50 nm.

To form the chromium nitride layer 19, the flow rate of the nitrogen gas is about 100 sccm. The other technological parameters are similar to the process of forming the bonding layer 13. The sputtering time is about 10 min. The thickness of the chromium nitride layer 19 is about 20 nm.

Example II

In this embodiment, the vacuum sputtering coating machine 20 is similar to the first embodiment.

To clean the substrate 11 by argon gas plasma, the flow rate of the argon gas is about 500 sccm. A bias voltage of about −200V is applied to the substrate 11. The cleaning time is about 10 min.

To form the bonding layer 13, the flow rate of the argon gas is about 150 sccm. A bias voltage of about −300V is applied to the substrate 11. The substrate 11 is heated to at a temperature of about 120° C. The sputtering time is about 10 min. A thickness of the bonding layer 13 is about 50 nm.

To form the iridium layer 15, the power of the iridium target 24 is about 8 kw. The flow rate of the argon gas is about 150 sccm. A bias voltage of about −300V is applied to the substrate 11. The substrate 11 is heated to at a temperature of about 120° C. The sputtering time is 10 about min. A thickness of the iridium layer 15 is about 30 nm.

To form the chromium oxynitride layer 17, the flow rate of the oxygen gas is about 100 sccm. The flow rate of the nitrogen gas is about 300 sccm. The other technological parameters are similar to the process of forming the bonding layer 13. The sputtering time is about 100 min. A thickness of the chromium oxynitride layer 17 is about 500 nm.

To form the chromium nitride layer 19, a flow rate of the nitrogen gas is about 300 sccm. The other technological parameters are similar to the process of forming the bonding layer 13. The sputtering time is about 20 min. The thickness of the chromium nitride layer 19 is about 80 nm.

A test of high-temperature oxidation resistance is applied to the coated articles 10 achieved by the above methods. The details and the result of the test method are described as follows.

The test instrument is a tubular furnace for thermal treatment. During the test, a speed rate of heating the coated articles 10 is about 10° C./min. A temperature of air in the tubular furnace is about 800° C., and the temperature is maintained for about 10 min.

The test result shows that the coated articles 10 do not appear to be oxidized or be peeled off after the thermal treatment Even if the test is repeated for three time.

It should be understood that the bonding layer 13, the iridium layer 15, the chromium oxynitride layer 17 and the chromium nitride layer 19 are formed on the substrate 11 in that order. The layer system of the coated article 10 has a good transition, and no obvious stress is formed inside the layers 13, 15, 17, 19. The chromium oxynitride layer 17 is compact, which can prevent oxygen in the air from getting into and spreading in the layers. Since the iridium layer 15 and the chromium oxynitride layer 17 are not easily oxidized at a temperature of about 800° C., the coated articles 10 can be used for a long times at high temperatures.

It is to be understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
a substrate;
a bonding layer formed on the substrate;
an iridium layer directly formed on the bonding layer;
a chromium oxynitride layer directly formed on the iridium layer; and
a chromium nitride layer directly formed on the chromium oxynitride layer.

2. The coated article as claimed in claim 1, wherein the substrate is made of die steel.

3. The coated article as claimed in claim 1, wherein the bonding layer is made of chromium.

4. The coated article as claimed in claim 1, wherein the bonding layer is formed by magnetron sputtering and has a thickness in a range of about 20 nm to about 50 nm.

5. The coated article as claimed in claim 1, wherein the iridium layer is formed by magnetron sputtering and has a thickness in a range of about 10 nm to about 30 nm.

6. The coated article as claimed in claim 1, wherein the chromium oxynitride layer is formed by magnetron sputtering and has a thickness in a range of about 50 nm to about 500 nm.

7. The coated article as claimed in claim 1, wherein the chromium nitride layer is formed by magnetron sputtering, and has a thickness in a range of about 20 nm to about 80 nm.

* * * * *